United States Patent [19]

Mori et al.

[11] Patent Number: 4,907,196
[45] Date of Patent: Mar. 6, 1990

[54] SEMICONDUCTOR MEMORY DEVICE USING RESONANT-TUNNELING TRANSISTOR

[75] Inventors: Toshihiko Mori; Toshiro Futatsugi, both of Isehara, Japan

[73] Assignee: Fujitsu Limited, Kawasaki, Japan

[21] Appl. No.: 184,222

[22] Filed: Apr. 21, 1988

[30] Foreign Application Priority Data

Apr. 28, 1987 [JP] Japan .............................. 62-103206
Apr. 13, 1988 [JP] Japan .............................. 63-91117

[51] Int. Cl.$^4$ ..................... G11C 11/00; H01L 27/12
[52] U.S. Cl. ....................................... 365/159; 357/4; 357/16; 357/57
[58] Field of Search ............... 365/159, 174, 179; 357/4, 7, 57, 34, 16

[56] References Cited

U.S. PATENT DOCUMENTS

| | | | |
|---|---|---|---|
| 4,712,121 | 12/1987 | Yokoyama | 357/4 |
| 4,721,983 | 1/1988 | Frazier | 357/4 |
| 4,786,957 | 11/1988 | Muto | 357/34 |
| 4,788,662 | 11/1988 | Mori | 365/159 |

OTHER PUBLICATIONS

"Resonant-Tunneling Hot Electron Transistors (RHET): Potential and Applications", Naoki Yokoyama, Extended Abstracts of the 18th (1986, International), Conference on Solid State Devices and Materials, Tokyo, 1986, pp. 347-350.

*Primary Examiner*—Joseph A. Popek
*Attorney, Agent, or Firm*—Armstrong, Nikaido, Marmelstein, Kubovcik & Murray

[57] ABSTRACT

A semiconductor memory device comprises a transistor having such a current characteristic that a base current has a differential negative resistance characteristic and a collector current greatly flows after the differential negative resistance characteristic occurs in the base current when a base-emitter voltage is increased, a load coupled in series between a collector and a base of the transistor, first and second input terminals coupled to the base of the transistor through a base resistance of the transistor, and an ouptut terminal coupled to the collector of the transistor.

26 Claims, 8 Drawing Sheets

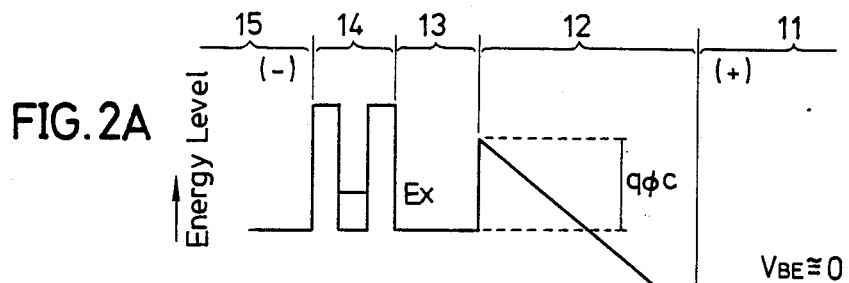
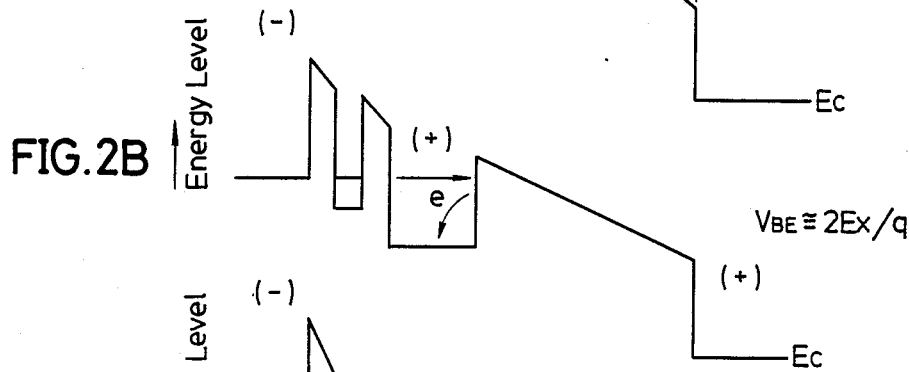
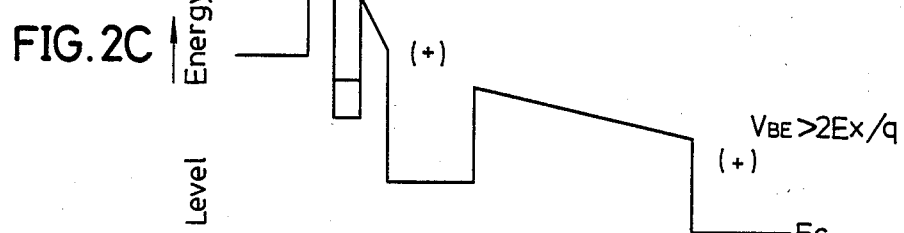
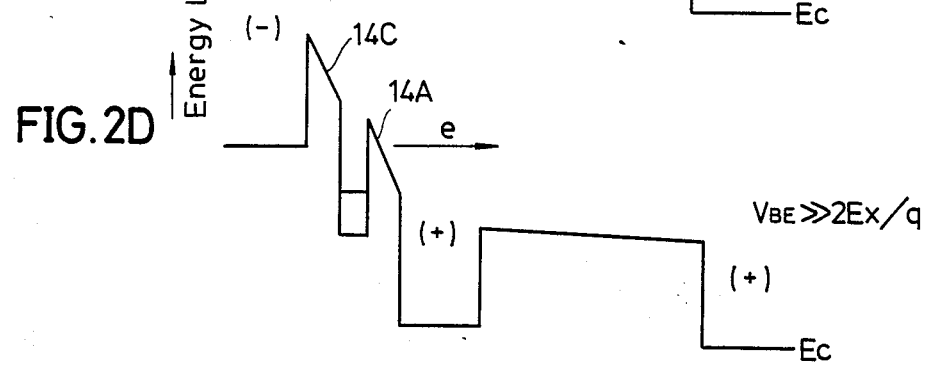
FIG. 2A
FIG. 2B
FIG. 2C
FIG. 2D

FIG. 9A
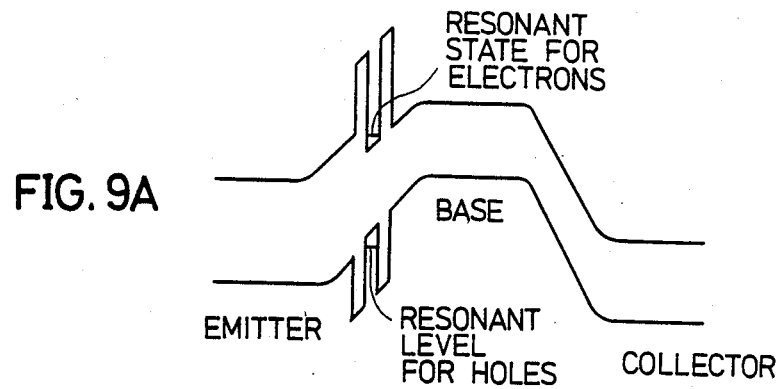
FIG. 9B
FIG. 9C
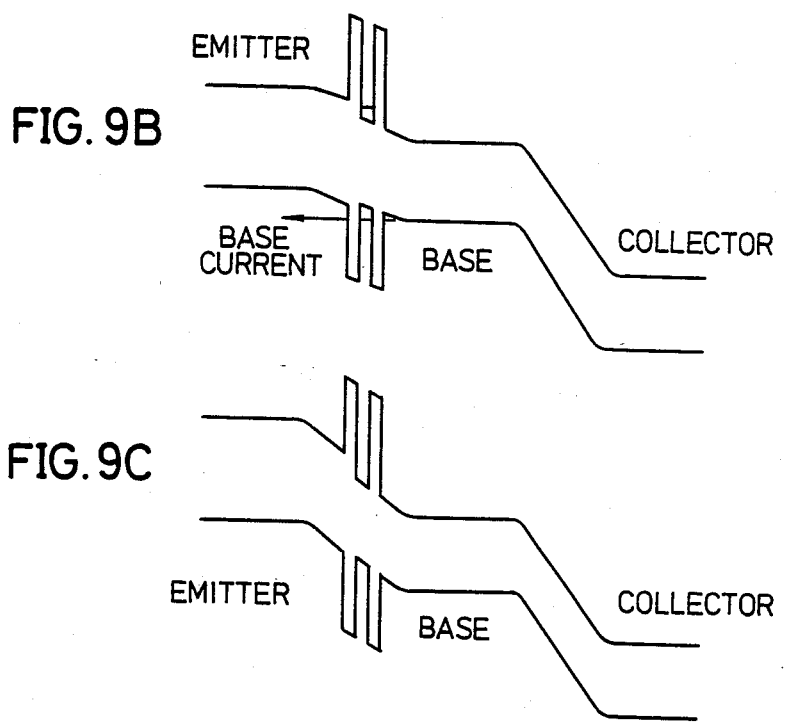

SEMICONDUCTOR MEMORY DEVICE USING RESONANT-TUNNELING TRANSISTOR

BACKGROUND OF THE INVENTION

The present invention generally relates to semiconductor memory devices, and more particularly to a semiconductor memory device using a resonant-tunneling transistor (hereinafter simply referred to as an RTT).

Generally, in a static random access memory (SRAM), at least four field effect transistors (FETs) are used to constitute one memory cell. Out of the four FETs, two FETs are used for flip-flop circuit and the remaining two FETs are used for a transfer gate. On the other hand, in the case of double emitter bipolar transistors, at least two double emitter bipolar transistors are used to constitute one memory cell.

Presently, one of the greatest technical problems to be solved in semiconductor integrated circuit devices concerns the realization of a high integration density, and a semiconductor memory device is no exception.

Conventionally, in order to obtain a high integration density, attempts have been made to miniaturize the transistor itself. But sooner or later, it will reach a stage of deadlock where the miniaturization of the transistor is carried out to the limit according to the present technology. For this reason, it is necessary to take other measures to obtain the high integration density.

One conceivable method of breaking the deadlock in the realization of the high integration density is to reduce the number of transistors constituting the semiconductor integrated circuit device without changing the function and effect of the semiconductor integrated circuit device. However, in the case of the semiconductor memory device, it is reaching a stage of deadlock where the demands have been satisfied to a point near the limit according to the present technology, as long as ordinary transistors are used.

Therefore, there is a strong demand to realize a semiconductor memory device the integration density of which can be increased considerably.

SUMMARY OF THE INVENTION

Accordingly, it is a general object of the present invention to provide a novel and useful semiconductor memory device using RTT in which the problems described before are eliminated and the demands are satisfied.

Another and more specific object of the present invention is to provide a semiconductor memory device which uses as an active element an RTT such as a resonant-tunneling hot electron transistor (RHET) and a resonant-tunneling bipolar transistor (RBT). According to the semiconductor memory device of the present invention, it is possible to considerably reduce the number of transistors which are required and accordingly improve the integration density of the semiconductor integrated circuit.

Still another object of the present invention is to provide a semiconductor memory device comprising a transistor having such a current characteristic that a base current has a differential negative resistance characteristic and a large collector current flows after the differential negative resistance characteristic occurs in the base current when a base-emitter voltage is increased, a load coupled in series between a collector and a base of the transistor, first and second input terminals coupled to the base of the transistor through a base resistance of the transistor, and an output terminal coupled to the collector of the transistor. The transistor may either be an RHET or an RBT. According to the semiconductor memory device of the present invention, it is possible to considerably reduce the number of transistors which are required and accordingly improve the integration density of the semiconductor integrated circuit.

A further object of the present invention is to provide a semiconductor memory device comprising a bit line, a word line, a read line, and a memory cell comprising a transistor having such a current characteristic that a base current has a differential negative resistance characteristic and a large collector current flows after the differential negative resistance characteristic occurs in the base current when a base-emitter voltage is increased, a load coupled in series between a collector and a base of the transistor, first and second input terminals coupled to the base of the transistor through a base resistance of the transistor, and an output terminal coupled to the collector of the transistor. The first input terminal is coupled to the word line, the second input terminal is coupled to the bit line, and the output terminal is coupled to the read line. The transistor may either be an RHET or an RBT. According to the semiconductor memory device of the present invention, a write-in of an information is carried out by applying a high or low level signal to both the first and second input terminal, and a read-out of a stored information is carried out by applying a medium level signal to the first input terminal through the word line and applying a timing pulse signal to the second input terminal through the bit line. The stored information is read by detecting the size of the potential change in the signal level on the read line.

Another object of the present invention is to provide a semiconductor memory device comprising a plurality of bit lines, a plurality of word lines, a plurality of read lines, and a memory cell array constituted by a plurality of identical memory cells, where each of the memory cells are connected to one of the bit lines, one of the word lines and one of the read lines. Each of the memory cells comprise a transistor having such a current characteristic that a base current has a differential negative resistance characteristic and a large collector current flows after the differential negative resistance characteristic occurs in the base current when a base-emitter voltage is increased, a load coupled in series between a collector and a base of the transistor, first and second input terminals coupled to the base of the transistor through a base resistance of the transistor, and an output terminal coupled to the collector of the transistor. The first input terminal is coupled to a corresponding one of the word lines, the second input terminal is coupled to a corresponding one of the bit lines, and the output terminal is coupled to a corresponding one of the read lines. The transistor may either be an RHET or an RBT. According to the semiconductor memory device of the present invention, a write-in of an information to a predetermined memory cell is carried out by applying a high or low level signal to both the first and second input terminal of the predetermined memory cell, and a read-out of a stored information is carried out by applying a medium level signal to the first input terminal through a predetermined word line which is coupled to the predetermined memory cell and applying a timing pulse signal to the second input terminal through the bit line which is coupled to the predetermined memory cell. The stored information is read by detecting the size of the potential change in the signal on a predetermined read line which is coupled to the predetermined memory cell.

Other objects and further features of the present invention will be apparent from the following detailed description when read in conjunction with the accompanying drawings.

BRIEF DESCRIPTION OF THE DRAWINGS

FIGS. 2(A) through 2(D) are energy band diagrams for explaining the operating principle of the RHET;

FIGS. 9A through 9C show energy band diagrams for explaining the operating principle of the RBT;

DETAILED DESCRIPTION

Recently, there is active research and development in the so-called RTT which uses a resonant-tunneling carrier as a carrier injecting source such as the resonant-tunneling hot electron transistor (hereinafter simply referred to as an RHET).

Figure 1:
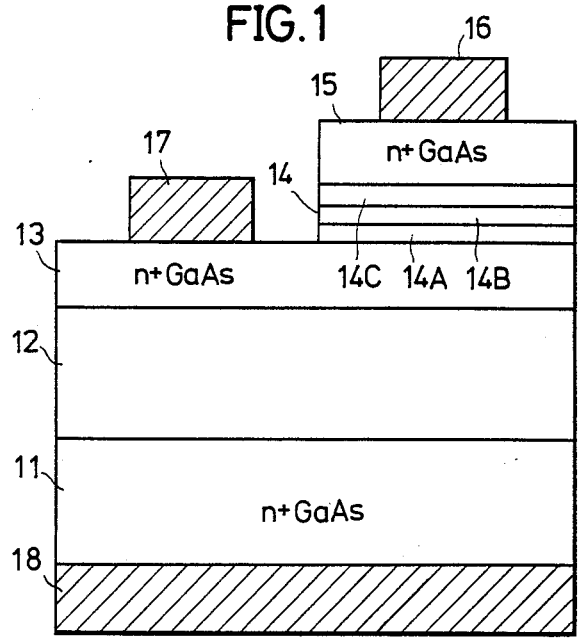
FIG. 1 is a cross sectional view showing an essential part of an RHET which is used in a first embodiment of the semiconductor memory device according to the present invention.

First, a description will be given on the RHET which is a kind of RTT and is used in a first embodiment of the semiconductor memory device according to the present invention, by referring to FIG. 1. FIG. 1 shows a cross sectional view of an essential part of the RHET.

In FIG. 1, an $Al_yGa_{1-y}As$ collector potential barrier layer 12 is formed on one side of an $n^+$-type GaAs collector layer 11, and an $n^+$-type GaAs base layer 13 is formed on the collector potential barrier layer 12. A superlattice layer (emitter barrier layer) 14 is formed on the base layer 13, and an $n^+$-type GaAs emitter layer 15 is formed on the superlattice layer 14. An emitter electrode 16 is formed on the emitter layer 15, a base electrode 17 is formed on the base layer 13, and a collector electrode 18 is formed on the other side of the collector layer 11. The superlattice layer 14 comprises a GaAs quantum well layer 14B which is sandwiched between a pair of $Al_xGa_{1-x}As$ barrier layers 14A and 14C. However, it is not essential that the superlattice layer 14 is constituted by two barrier layers and one quantum well layer, and a plurality of quantum well layers and a number of barrier layers required to form these quantum well layers may be provided according to the needs.

FIGS. 2A through 2D are energy band diagrams for explaining the operating principle of the RHET. In FIGS. 2A through 2D, those parts which are the same as those corresponding parts in FIG. 1 are designated by the same reference numerals and characters, and a description thereof will be omitted. Furthermore, in FIGS. 2A through 2D, the ordinate indicates the energy level, q denotes the charge of the carrier (electron), $\phi_C$ denotes the conduction band discontinuity between the collector potential barrier layer 12 and the base layer 13, and $V_{BE}$ denotes the base-emitter voltage of the RHET.

FIG. 2A shows the energy band diagram for the case where the base-emitter voltage $V_{BE}$ is zero or close to zero. In FIG. 2A, a voltage $V_{CE}$ is applied across the collector and the emitter of the RHET, but the energy level of the quantum well layer 14B differs from the energy level $E_X$ of the sub band because the base-emitter voltage $V_{BE}$ is virtually zero. As a result, it is impossible for the electrons in the emitter layer 15 to reach the base layer 13 by tunneling through the superlattice layer 14, and there is no current flow in the RHET.

FIG. 2B shows the energy band diagram for the case where the base-emitter voltage $V_{BE}$ is approximately equal to $2E_X/q$. In FIG. 2B, the energy level of the emitter layer 15 coincides with the energy level $E_X$ of the sub band within the quantum well layer 14. For this reason, the electrons in the emitter layer 15 are injected to the base layer 13 by resonant-tunneling through the superlattice layer 14. The potential energy ($\simeq 2E_X$) is converted into kinetic energy in the base layer 13 and the electrons assume the so-called hot state (hot electrons), and the electrons injected into the base layer 13 are ballistically transferred to the collector layer 11 through the base layer 13. But when the energy level of the collector potential barrier layer 12 is higher than $2E_X$, virtually all of the electrons are blocked by the collector potential barrier layer 12, and as a result, there is a base current flow and no collector current flow.

FIG. 2C shows the energy band diagram for the case where the base-emitter voltage $V_{BE}$ is greater than $2E_X/q$. In this case, no resonant-tunneling effect occurs because the energy level of the emitter layer 15 is greater than the energy level $E_X$ of the sub band within the quantum well layer 14B. Thus, there is no injection of electrons from the emitter layer 15 to the base layer 13, and the current flow decreases.

FIG. 2D shows the energy band diagram for the case where the base-emitter voltage $V_{BE}$ is considerably large compared to $2E_X/q$. In this case, between the two barrier layers 14A and 14C, the barrier layer 14A which is closer to the base layer 13 has an energy level lower than the energy level of the emitter layer 15. Hence, the electrons tunnel directly through the the barrier layer 14C which is closer to the emitter layer 15. In addition, since the electrons tunneling directly through the barrier layer 14C have an energy level sufficiently large compared to the energy level of the collector potential barrier layer 12, the electrons reach the collector layer 11.

Figure 3:
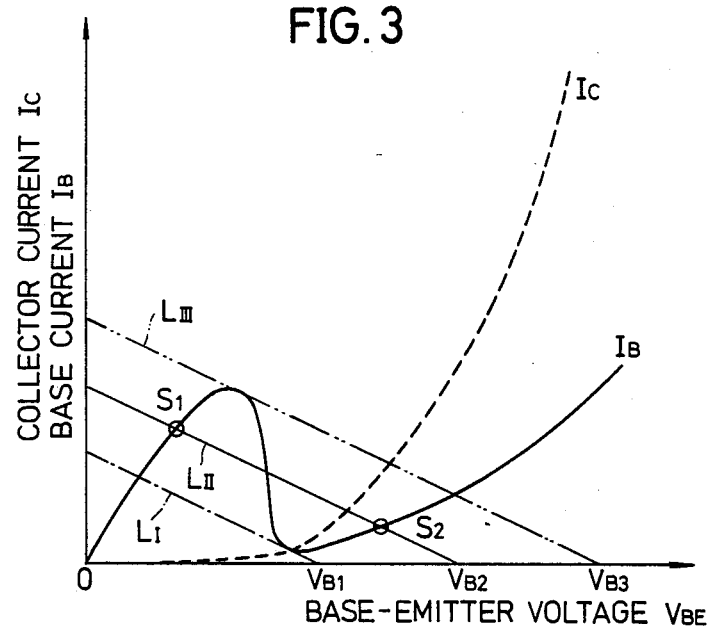
FIG. 3 is a graph showing the base current versus base-emitter characteristic and the collector current versus base-emitter characteristic of the RHET.

FIG. 3 shows a voltage versus current characteristic of the RHET. In FIG. 3, the abscissa indicates a base-emitter voltage $V_{BE}$ of the RHET and the ordinate indicates a base current $I_B$ and a collector current $I_C$ of the RHET. In addition, a one-dot chain line $L_I$ denotes a load line for the case where a base input voltage $V_B$ to the RHET is $V_{B1}$, a solid line $L_{II}$ denotes a load line for the case where the base input voltage $V_B$ is $V_{B2}$, and a two-dot chain line $L_{III}$ denotes a load line for the case where the base input voltage $V_B$ is $V_{B3}$. Furthermore, $S_1$ and $S_2$ denote stable points of operation.

As may be seen from FIG. 3, the base current $I_B$ of the RHET has an approximately N-shaped characteristic, that is, the so-called differential negative resistance characteristic. Hence, virtually no collector current $I_C$ flows until the differential negative resistance characteristic appears in the base current $I_B$, but the collector current $I_C$ rises sharply after the negative resistance characteristic appears in the base current $I_B$. By using this characteristic of the RHET, it is possible to constitute a flip-flop circuit by one RHET.

Figure 4:
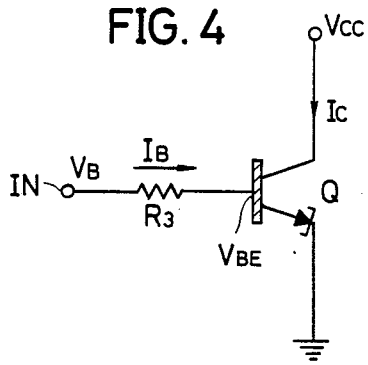
FIG. 4 is a circuit diagram showing an embodiment of a flip-flop circuit using the RHET.

FIG. 4 shows an embodiment of the flip-flop circuit using the RHET. In FIG. 4, the same designations are used as in FIG. 3. The flip-flop circuit shown in FIG. 4 comprises an RHET Q, and a resistor R3 connected to the base of the RHET Q. Vcc denotes a positive power source voltage and $V_B$ denotes the base input voltage applied to an input terminal IN.

A description will now be given on the operation of the flip-flop circuit shown in FIG. 4 by referring to FIG. 3.

When $V_B = V_{B2}$, there are the two stable points $S_1$ and $S_2$ on the load line $L_{II}$. At the stable point $S_1$, the RHET Q is OFF because virtually no collector current $I_C$ flows. On the other hand, at the stable point $S_2$, the RHET Q is ON because the collector current $I_C$ flows.

In order to move from the stable point $S_1$ to the stable point $S_2$, that is, in order for the RHET Q to undergo a transistion from the ON state to the OFF state, the base input voltage $V_B$ is once set smaller than $V_{B1}$ and is again set equal to $V_{B2}$.

Therefore, as may be understood from this operation, the flip-flop circuit shown in FIG. 4 correctly operates as a flip-flop even though only a single RHET Q is used as the active element.

The present invention effectively utilizes this flip-flop circuit which uses only a single RTT such as the RHET, by modifying this flip-flop circuit for use in an SRAM so that the integration density thereof can be improved considerably.

Figure 5:
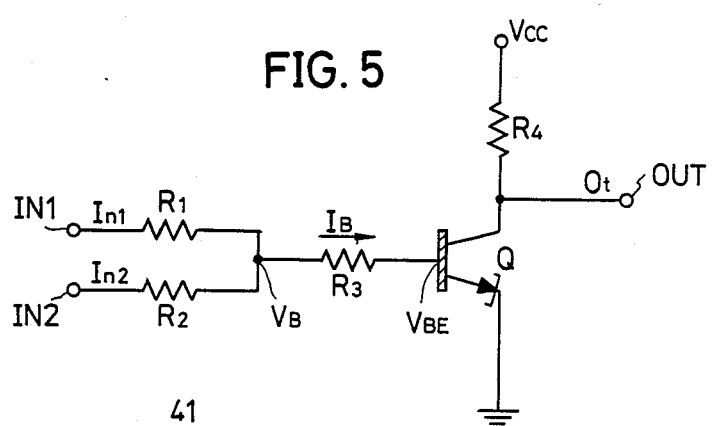
FIG. 5 shows an essential part of a memory cell of the first embodiment of the semiconductor memory device according to the present invention for explaining the operating principle thereof.

FIG. 5 shows an essential part of a memory cell of the first embodiment of the semiconductor memory device according to the present invention for explaining the operating principle thereof. In FIG. 5, those parts which are the same as those corresponding parts in FIG. 4 are designated by the same reference numerals, and a description thereof will be omitted. In FIG. 5, R1, R2 and R4 denote resistors, In1 and In2 denote input signals respectively applied to input terminals IN1 and IN2, and Ot denotes an output signal output from an output terminal OUT. It is assumed that the base input voltage $V_B$ is derived from the input signals In1 and In2 which pass through the respective resistors R1 and R2.

FIGS. 6(A) through 6(D) are timing charts for explaining the operation of the semiconductor memory device shown in FIG. 5. FIGS. 6(A) and 6(B) show the input signals In1 and In2, respectively. FIG. 6(C) shows the base input voltage $V_B$, and FIG. 6(D) shows the output signal Ot. In FIGS. 6(A) through 6(D), the abscissa denotes the time while the ordinate denotes the level, and the same designations are used as in FIGS. 3 and 5.

Next, a description will be given on the operation of the semiconductor memory device shown in FIG. 5. When the resistances of the resistors R1 and R2 are set small compared to a resistance which is a sum of the base-emitter resistance of the RHET Q and the resistance of the resistor R3, the base input voltage $V_B$ is determined substantially dependent on the resistances of the resistors R1 and R2. In the present embodiment, it is assumed for convenience' sake that the resistances of the resistors R1 and R2 are the same, but the resistances may be mutually different. In the case where the resistances of the resistors R1 and R2 are the same, the base input voltage $V_B$ takes an intermediate value between the values of the input signals In1 and In2. In addition, when the operating point of the RHET Q is located at the stable point $S_1$, the RHET Q is nonconductive and in the OFF state, and the output signal Ot has a high level. On the other hand, the operating point of the RHET Q is located at the stable point $S_2$, the RHET Q is conductive and in the ON state, and the output signal Ot has a low level.

Depending on the combinations of the input signals In1 and In2, the value of the base input voltage $V_B$ which is an average voltage of the input signals In1 and In2 is set to one of three levels, namely a high level, a medium level and a low level. The medium level is an intermediate level between the high and low levels. When the input signals In1 and In2 both have the high level, the base input voltage $V_B$ also has a high level. When the input signals In1 and In2 both have the low level, the base input voltage $V_B$ also has a low level. The base input voltage $V_B$ otherwise has a medium level.

The write-in or storage of information to the semiconductor memory device is carried out as follows. In a first case, it is assumed that the operating point of the RHET Q is located at the stable point $S_1$ and the input signals In1 and In2 both have the high level as shown at times T2 and T4 in FIG. 6, that is, the base input voltage $V_B$ has the high level. When the base input voltage $V_B$ in this case is set greater than the voltage $V_{B3}$ in FIG. 3, the operating point of the RHET Q undergoes a transition from the stable point $S_1$ to the stable point $S_2$.

Figure 6:
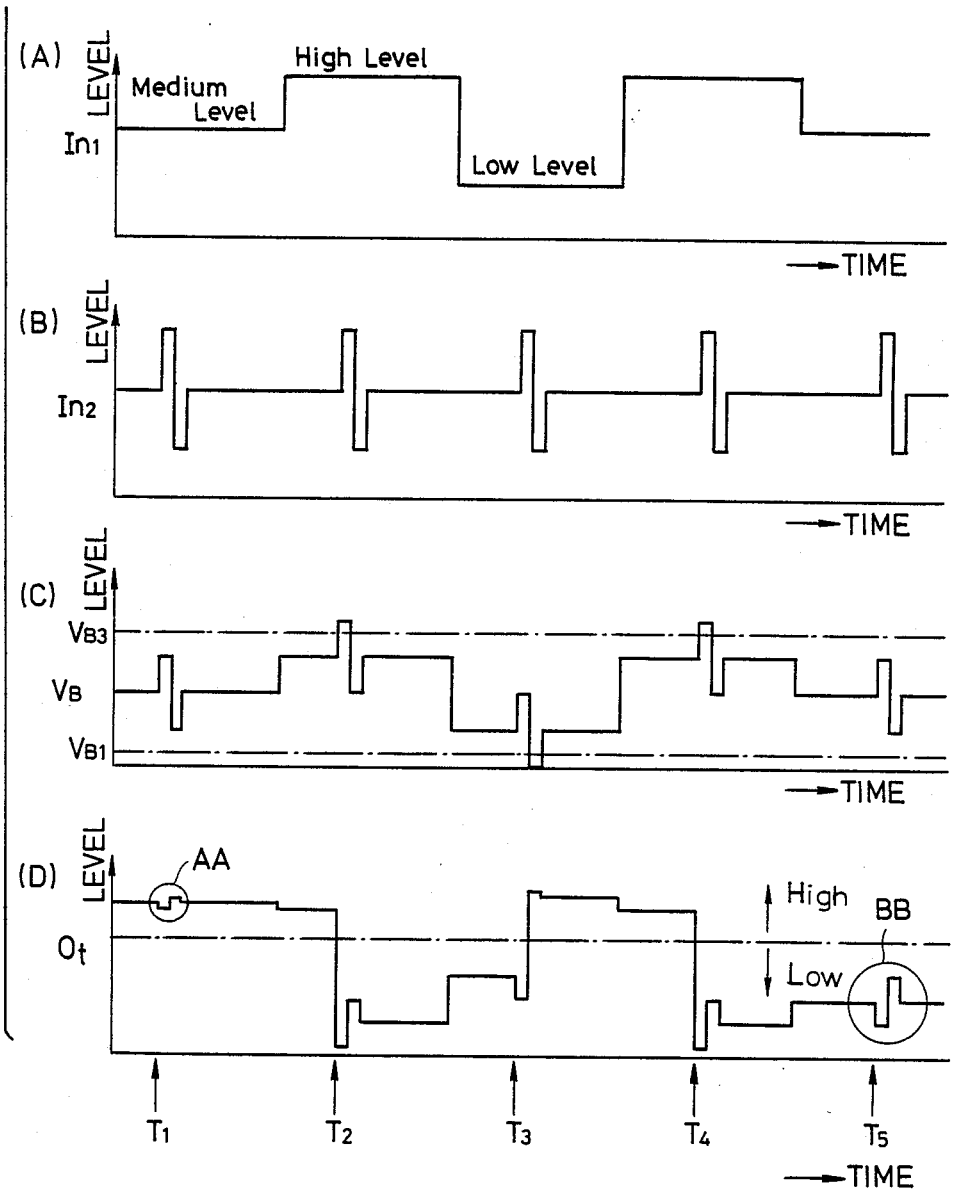
FIGS. 6(A) through 6(D) are timing charts for explaining the operation of the semiconductor memory device shown in FIG. 5.

On the other hand, in a second case, it is assumed that the input signals In1 and In2 both have the low level as shown at a time T3 in FIG. 6, that is, the base input voltage $V_B$ has the low level. When the base input voltage $V_B$ in this case is set smaller than the voltage $V_{B1}$ in FIG. 3, the operating point of the RHET Q undergoes a transition from the stable point $S_2$ to the stable point $S_1$.

Furthermore, in a third case, it is assumed that the one of the input signals In1 and In2 has the high level and the other of the input signals In1 and In2 has the low level. When the base input voltage $V_B$ in this case is set between the voltages $V_{B3}$ and $V_{B1}$ in FIG. 3, the operating point of the RHET Q undergoes no transition.

In summary, the write-in (or rewriting) of the information is carried out only when both the input signals In1 and In2 have the high level or the low level. Otherwise, the information is maintained stored. In other words, the semiconductor memory device correctly carries out the operation of a memory. The input signal In2 having the pulse form shown in FIG. 6(B) may be regarded as a write-in (rewriting) timing pulse signal. In this case, if the input signal In1 has the high level when the write-in timing pulse signal (In2) is received, the output signal Ot changes from the high level to the low level. On the other hand, if the input signal In1 has the low level when the write-in timing pulse signal (In2) is received, the output signal Ot changes from the low level to the high level.

The read-out of the stored information from the semiconductor memory device is carried out as follows. In this case, the input signal In1 is set to the medium level. As a result, the operating point of the RHET Q will not undergo a transition from the stable point $S_1$ to the stable point $S_2$ or vice versa, even when the input signal In2 is received. Accordingly, no write-in (rewriting) takes place.

In the case where the operating point of the RHET Q is located at the stable point $S_1$, the RHET Q is nonconductive and is in the OFF state when the input signal In1 has the medium level as shown at a time T2 in FIG. 6 and the input signal In2 is received as the timing pulse signal. For this reason, only an extremely small potential change occurs in the output signal Ot. In other words, even when a potential change occurs in the input signal In2, virtually no potential change occurs in the output signal Ot, and this state is encircled and indicated by AA in FIG. 6(D).

On the other hand, in the case where the operating point of the RHET Q is located at the stable point $S_2$, the RHET Q is conductive and is in the ON state when the input signal In1 has the medium level as shown at a time T5 in FIG. 6 and the input signal In2 is received as the timing pulse signal. In addition, as may be seen from FIG. 6, even a slight potential change in the base input voltage $V_B$ causes a sudden change in the collector current $I_C$, and this state is encircled and indicated by BB in FIG. 6(D).

Therefore, it is possible to know which one of the stable points $S_1$ and $S_2$ the operating point of the RHET Q is located at by detecting the size of the potential change in the output signal Ot, and accordingly read out the stored information from the semiconductor memory device. It is possible to read a first logic value from the memory cell when the potential change in the output signal Ot is small, and similarly read a second logic value from the memory different levels, namely, to high and low levels or vice versa, and no write-in is carried out on the non-selected memory cell $MC_{12}$.

On the other hand, when reading the stored information from the memory cell $MC_{11}$, for example, the timing pulse signal is applied to the bit line BL1 from the bit line driver $20_1$ and the word line WL1 is set to the medium level by the word line driver $21_1$. As a result, the stored information is read out on the read line RL1 and is sensed and amplified in the sense amplifier $22_1$. As for the non-selected memory cells such as the memory cell $MC_{12}$, the connected word line WL2 is set to a level other than the medium level, and no read-out is carried out on the non-selected memory cell $MC_{12}$. Therefore, no change occurs in the RHETs Q of the non-selected memory cells. When the potential change on the read line RL1 is small, the sense amplifier $22_2$ outputs a signal having a first logic level. On the other hand, the sense amplifier $22_1$ outputs a signal having a second logic value when the potential change on the read line RL1 is large.

Figure 7:
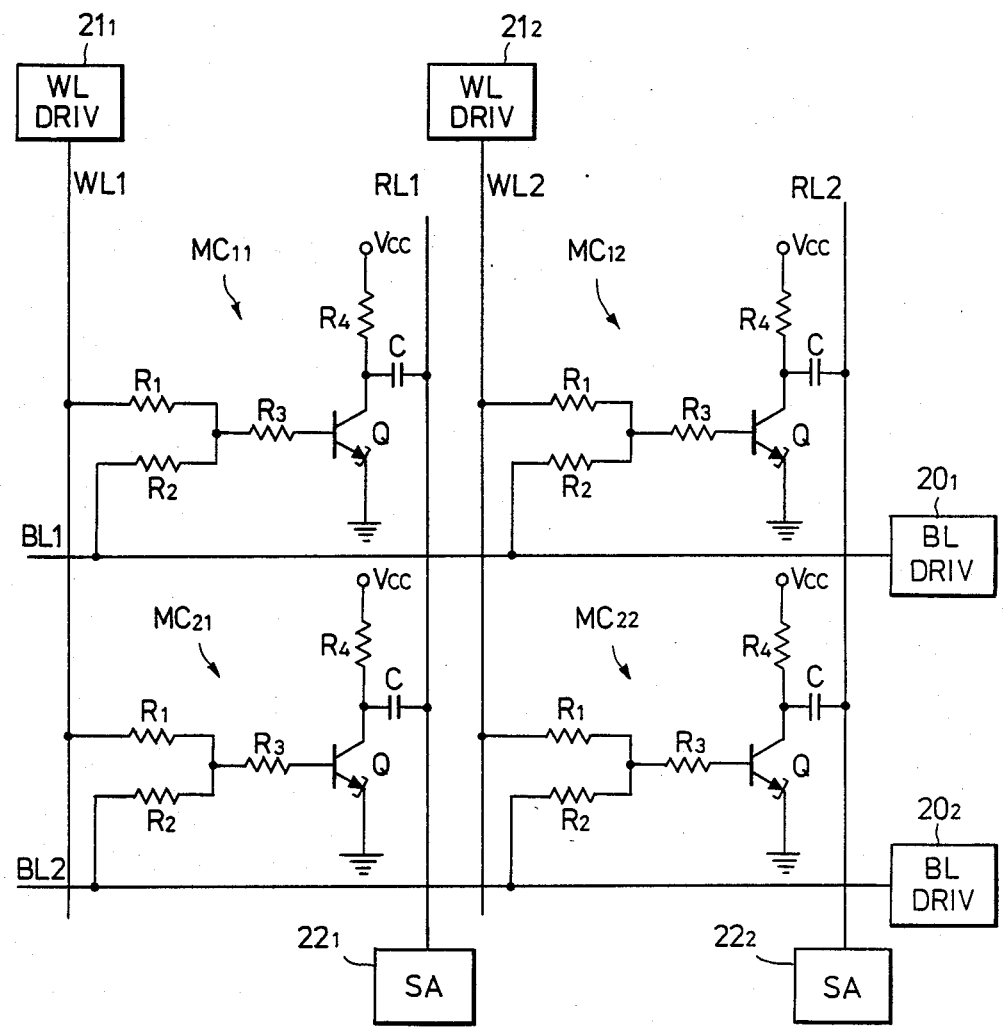
FIG. 7 is a circuit diagram showing an essential part of the first embodiment of the semiconductor memory device according to the present invention.

However, the information read out from the selected memory cell, that is, the current on the read line (RL1 in this case) which is connected to the selected memory cell may affect the non-selected memory cells which are also connected to the same read line. In this case, a capacitor C is coupled between the output of the memory cell (that is, the collector of the RHET Q) and the corresponding read line as shown in FIG. 7 so as to obtain only the voltage change and avoid such undesirable effects on the non-selected memory cells. It is not essential to provide the capacitor C.

According to the first embodiment, it is possible to constitute the memory cell of the SRAM by only a single RHET and resistors. Hence, the number of active elements required in the semiconductor memory device is considerably reduced, and the integration cell when the potential change in the output signal Ot is large.

FIG. 7 is a circuit diagram showing an essential part of the first embodiment of the semiconductor memory device according to the present invention, that is, a portion of a memory cell array made up of the memory cells $MC_{11}$, $MC_{12}$, ..., $MC_{21}$, $MC_{22}$, ... of the type shown in FIG. 5. In FIG. 7, those parts which are the same as those corresponding parts in FIG. 5 are designated by the same reference numerals, and a description thereof will be omitted. In FIG. 7, each memory cell is coupled to one of bit lines BL1, BL2, ..., one of word lines WL1, WL2, ..., and one of read lines RL1, RL2, .... The bit lines BL1, BL2, ... are coupled to corresponding bit line drivers $20_1$, $20_2$, ..., the word lines WL1, WL2, ... are coupled to corresponding word line drivers $21_1$, $21_2$, ..., and the read lines RL1, RL2, ... are coupled to corresponding sense amplifiers $22_1$, $22_2$, ....

The input signals In1 to each of the RHETs Q of the memory cells $MC_{11}$, $MC_{12}$, ... are received from the word line drivers $21_1$, $21_2$, ... through the corresponding word lines WL1, WL2, .... The input signals In2 to each of the RHETs Q of the memory cells $MC_{11}$, $MC_{12}$, ... are received from the bit line drivers $20_1$, $20_2$, ... through the corresponding word lines BL1, BL2, .... In addition, the output signals Ot of the RHETs Q of the memory cells $MC_{11}$, $MC_{12}$, ... are supplied to the sense amplifiers $22_1$, $22_2$, ... through the corresponding read lines RL1, RL2, ....

For example, when writing (or rewriting) an information into the memory cell $MC_{11}$, both the bit line BL1 and the word line WL1 are set to the high or low level by the respective word line driver $21_1$ and bit line driver $20_1$. As for the non-selected memory cells such as the memory cell $MC_{12}$, the connected bit line BL1 and the word line WL2 are set to mutually density can be improved considerably.

Next, a description will be given on a second embodiment of the semiconductor memory device according to the present invention.

Figure 8:
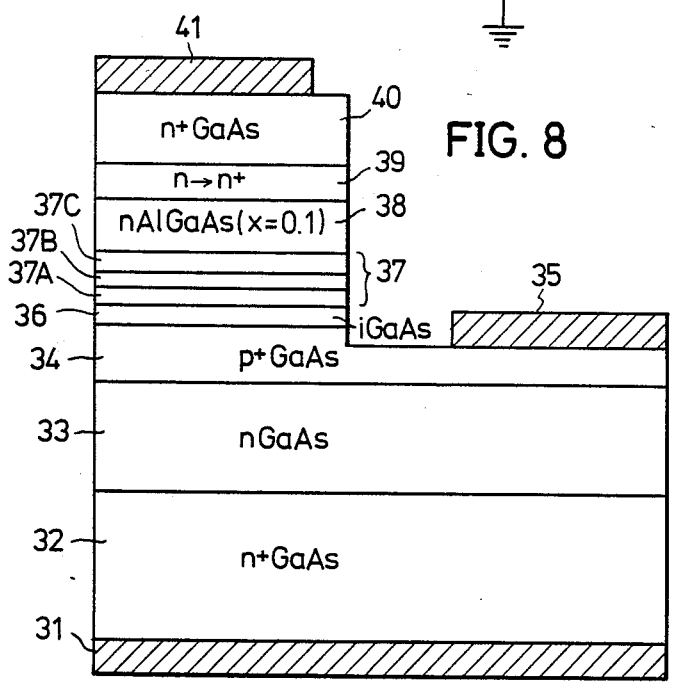
FIG. 8 is a cross sectional view showing an essential part of an RBT which is used in a second embodiment of the semiconductor memory device according to the present invention.

First, a description will be given on a resonant-tunneling bipolar transistor (hereinafter simply referred to as an RBT) which is a kind of RTT and is used in the second embodiment of the semiconductor memory device according to the present invention, by referring to FIG. 8. FIG. 8 shows a cross sectional view of an essential part of the RBT.

In FIG. 8, the RBT comprises a collector electrode 31, an n+-type GaAs collector layer 32, an n-type GaAs layer 33 having a film thickness of 4000 Å with an impurity concentration of $1 \times 10^{17}$ cm$^{-3}$, a p+-type GaAs base layer 34 having a film thickness of 1500 Å and an impurity concentration of $5 \times 10^{18}$ cm$^{-3}$, a base electrode 35, an intrinsic GaAs spacer layer 36, a resonant-tunneling barrier layer 37, an n-type Al$_x$Ga$_{1-x}$As (x=0.1) layer 38 having a film thickness of 1000 Å and an impurity concentration of $1 \times 10^{18}$ cm$^{-3}$, a graded junction layer 39 having a film thickness of 500 Å and in which the impurity concentration changes from n-type to n+-type, an n+-type GaAs emitter layer 40 having a film thickness of 1500 Å and an impurity concentration of $6 \times 10^{18}$ cm$^{-3}$, and an emitter electrode 41. For example, the resonant-tunneling barrier layer 37 comprises an AlAs barrier layer 37A having a film thickness of 20 Å, a GaAs quantum well layer 37B having a film thickness of 50 Å, and a AlAs barrier layer 37C having a film thickness of 20 Å.

FIGS. 9A through 9C are energy band diagrams for explaining the RBT. In the RBT, an emitter barrier layer (resonant-tunneling barrier layer 37) is provided at a junction between emitter and base of the normal bipolar transistor. The current generated by the electron tunneling contributes to the collector current, and the current generated by the hole tunneling contributes to the base current. The emitter barrier layer comprises the two resonant barrier layers having such a film thickness that at least the carriers can tunnel therethrough, and the quantum well layer formed between the two resonant barrier layers. In the present embodiment, measures are taken so that when a predetermined bias voltage is applied across the emitter and base of the RBT, the resonant-tunneling of the holes occurs at the emitter barrier layer before the resonant-tunneling of the electrons. Accordingly, the differential negative resistance characteristic is generated in the base current, and the RBT becomes suited for use as the active element of a flip-flop circuit.

FIG. 9A shows the energy band diagram of the RBT for the case where the base-emitter voltage is zero, FIG. 9B shows the energy band diagram of the RBT for the case where the base-emitter voltage is applied and a base current flows due to the resonant-tunneling of the holes, and FIG. 9C shows the energy band diagram for the case where the base-emitter voltage is further applied and the base current no longer flows.

Figure 10A:
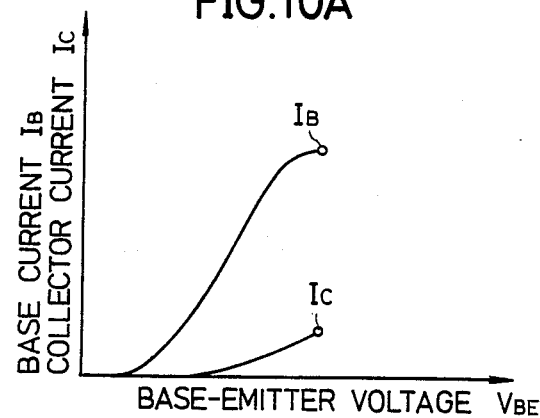
FIGS. 10A and 10B are graphs showing the base current versus base-emitter voltage characteristics and the collector current versus base-emitter voltage characteristics of the RBT in correspondence with FIGS. 9B and 9C, respectively.
Figure 10B:
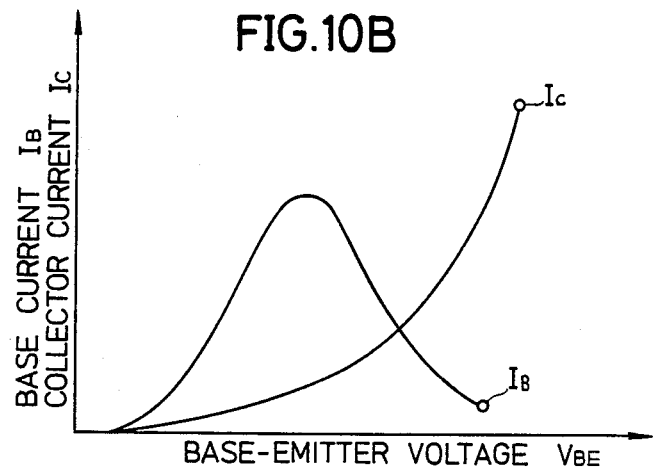

The voltage versus current characteristic of the RBT in correspondence with the energy band diagrams of FIGS. 9B and 9C are respectively shown in FIGS. 10A and 10B. In FIGS. 10A and 10B, $I_B$ denotes the base current, $I_C$ denotes the collector current, and $V_{BE}$ denotes the base-emitter voltage.

Figure 11A:
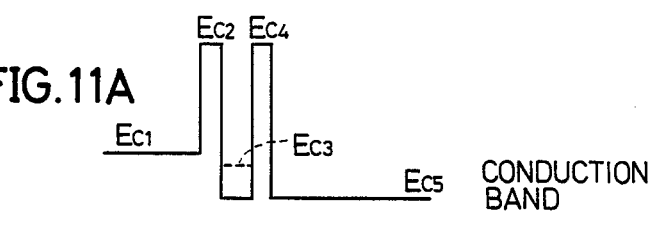
FIGS. 11A and 11B show energy band diagrams of the RBT for explaining the conditions for causing the resonant-tunneling of the holes before the resonant-tunneling of the electrons.
Figure 11A:
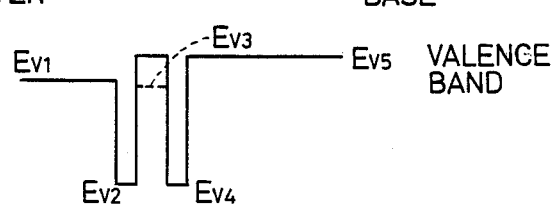
Figure 11B:
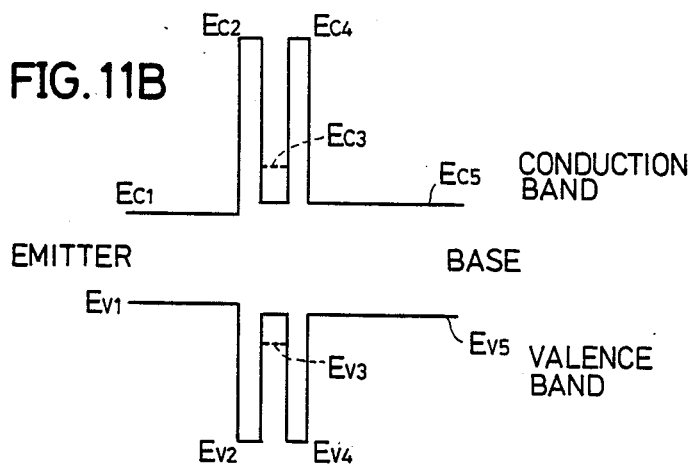

As two conditions for causing the resonant-tunneling of the holes before the resonant-tunneling of the electrons, the two conditions shown in FIGS. 11A and 11B are conceivable. In FIGS. 11A and 11B, $E_{C1}$, $E_{C2}$, $E_{C3}$, $E_{C4}$ and $E_{C5}$ respectively denote the bottom of the conduction band on the emitter side, the bottom of the conduction band of a first resonant barrier of the emitter barrier layer, the bottom of the conduction band of a quantum well of the emitter barrier layer, the bottom of the conduction band of a second resonant barrier of the emitter barrier layer and the bottom of the conduction band on the base side. In addition, $E_{V1}$, $E_{V2}$, $E_{V3}$, $E_{V4}$ and $E_{V5}$ respectively denote the top of the valence band on the emitter side, the top of the valence band of a first resonant barrier of the emitter barrier layer, the top of the valence band of a quantum well of the emitter barrier layer, the top of the valence band of a second resonant barrier of the emitter barrier layer and the top of the valence band on the base side.

In FIG. 11A, there is a wide gap between the bottom of the conduction band and the top of the valence band on the emitter side, and the conditions $E_{C1} > E_{C3}$ and $E_{V1} > E_{V3} < E_{V5}$ stand. Accordingly, no resonant-tunneling of the electrons occurs and only the resonant-tunneling of the holes occurs.

On the other hand, in FIG. 11B, there is a narrow gap between the bottom of the conduction band and the top of the valence band on the emitter side, and the conditions $|E_{C3} - E_{C1}| > |E_{V3} - E_{V5}|$ and $E_{V1} > E_{V3} < E_{V5}$ stand. Thus, the resonant-tunneling of the holes occurs before the resonant-tunneling of the electrons.

In either of the cases shown in FIGS. 11A and 11B, at least the resonant-tunneling of the holes occurs before the resonant-tunneling of the electrons when a predetermined bias voltage is applied across the base and emitter of the RBT. As a result, the base current has the differential negative resistance, and the collector current greatly flows after this differential negative resistance appears in the base current. Since the junction between the base and collector of the RBT is a pn junction, the differential negative resistance occurs even under room temperature, unlike the RHET which must be operated at a low temperature in order to obtain the differential negative resistance.

The RBT shown in FIG. 8 described before has the characteristic shown in FIG. 11A.

Figure 12:
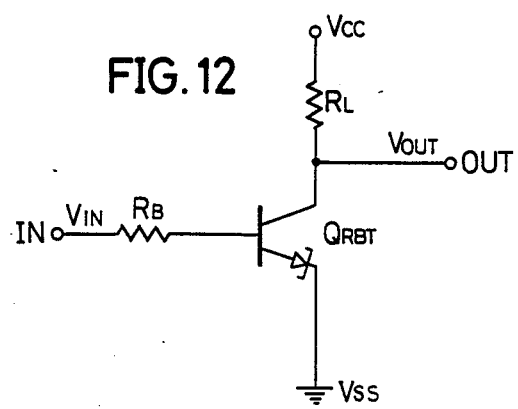
FIG. 12 is a circuit diagram showing an embodiment of a flip-flop circuit using the RBT.

FIG. 12 shows an embodiment of the flip-flop circuit using the RBT. In FIG. 12, the flip-flop circuit comprises an RBT $Q_{RBT}$, a resistor $R_L$ coupled to the collector of the RBT $Q_{RBT}$, and a resistor $R_B$ coupled to the base of the RBT $Q_{RBT}$. Vcc and $V_{SS}$ denote first and second power source voltages, $V_{IN}$ denotes a base input voltage applied to an input terminal IN, and $V_{OUT}$ denotes an output voltage outputted from an output terminal OUT. The flip-flop circuit shown in FIG. 12 correctly operates as a flip-flop even though only a single RBT $Q_{RBT}$ is used as the active element.

Figure 13:
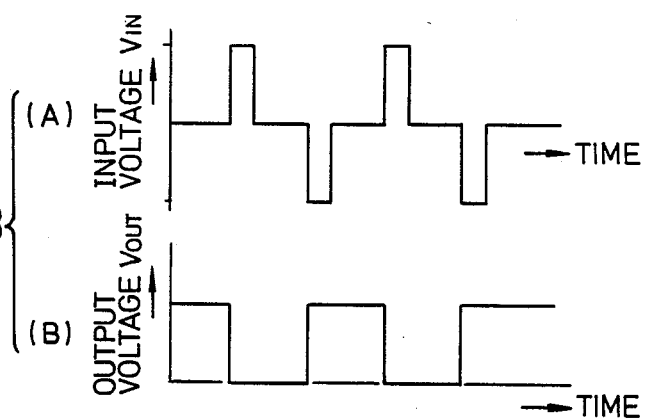
FIGS. 13(A) and 13(B) are timing charts for explaining the operation of the flip-flop circuit shown in FIG. 12.

When the base input voltage $V_{IN}$ shown in FIG. 13(A) is applied to the input terminal IN, the output voltage $V_{OUT}$ shown in FIG. 13(B) is outputted from the output terminal OUT. In other words, it is possible to carry out a flip-flop operation by using the fact that the resonant-tunneling of the holes occurs from the base to the emitter of the RBT $Q_{RBT}$ when a first voltage is applied across the emitter and base of the RBT $Q_{RBT}$ and the electrons are injected from the emitter to the base of the RBT $Q_{RBT}$ when a second voltage is applied across the emitter and base of the RBT $Q_{RBT}$. Since the differential negative resistance characteristic occurs in the base current of the RBT $Q_{RBT}$, the logic amplitude of the flip-flop circuit can be set relatively large. Therefore, it can be seen that the RBT $Q_{RBT}$ can be used in place of the RHET Q in FIGS. 5 and 7 to carry out essentially the same memory operation as in the first embodiment. However, the illustration of the memory cell and memory cell array using the RBT as the active element in the second embodiment will be omitted since the circuit diagrams thereof are essentially the same as those shown in FIGS. 5 and 7.

Further, the present invention is not limited to these embodiments, but various variations and modifications may be made without departing from the scope of the present invention.

What is claimed is:

1. A semiconductor memory device comprising:
   a transistor having a current characteristic that a base current has a differential negative resistance characteristic and a large collector current flows after the differential negative resistance characteristic occurs in a base current when a base-emitter voltage is increased;
   a load coupled in series to a circuit of a collector and an emitter of said transistor;
   first and second input terminals coupled to the base of said transistor through a base resistance of said transistor; and
   an output terminal coupled to the collector of said transistor.

2. A semiconductor memory device comprising:
   a transistor having such a current characteristic that a base current has a differential negative resistance characteristic and a large collector current flows after the differential negative resistance characteristic occurs in the base current when a base-emitter voltage is increased;
   a load coupled in series to a circuit of a collector and an emitter of said transistor;
   first and second input terminals coupled to the base of said transistor through a base resistance of said transistor; and
   an output terminal coupled to the collector of said transistor,
   a write-in operation of said semiconductor memory device being carried out by supplying one of high and low level signals to both said first and second input terminals, a read-out operation of said semiconductor memory device being carried out by supplying a medium level signal to one of said first and second input terminals and a timing pulse signal to the other of said first and second input terminals, said medium level signal having an intermediate level between said high and low levels.

3. A semiconductor memory device as claimed in claim 2 in which a stored information content is read out during the read-out operation depending on a size of a potential change in an output signal outputted from said output terminal.

4. A semiconductor memory device as claimed in claim 1 in which said transistor is a resonant-tunneling hot electron transistor.

5. A semiconductor memory device as claimed in claim 4 in which said resonant-tunneling hot electron transistor comprises a specific conductivity type collector layer, a collector barrier layer formed on said specific conductivity type collector layer, a specific conductivity type base layer formed on said collector barrier layer, an emitter barrier layer formed on said specific conductivity type base layer, and a specific conductivity type emitter layer formed on said emitter barrier layer, said emitter barrier layer comprising at least two barrier layers having such a film thickness that carriers can tunnel through and a quantum well layer provided between said two barrier layers, said collector barrier layer having a barrier height greater than a potential of carriers injected to said specific conductivity type base layer by resonant-tunneling through said emitter barrier layer when a first voltage is applied across said specific conductivity type base layer and said specific conductivity type emitter layer, the potential of carriers injected to said specific conductivity type base layer when a second voltage greater than said first voltage is applied across said specific conductivity type base layer and said specific conductivity type emitter layer being greater than the barrier height of said collector barrier layer, said specific conductivity type being one of n-type and p-type.

6. A semiconductor memory device as claimed in claim 1 in which said transistor is a resonant-tunneling bipolar transistor.

7. A semiconductor memory device as claimed in claim 6 in which said resonant-tunneling bipolar transistor comprises a first conductivity type collector layer, a second conductivity type base layer formed on said first conductivity type collector layer, an emitter barrier layer formed on said second conductivity type base layer, and a first conductivity type emitter layer formed on said emitter barrier layer, said emitter barrier layer comprising at least two barrier layers having such a film thickness that carriers can tunnel through and a quantum well layer provided between said two barrier layers, said first conductivity type emitter layer having a bottom of conduction band greater than that of said quantum well layer, said first conductivity type emitter layer having a top of valence band greater than that of said quantum well layer, said quantum well layer having a top of valence band smaller than that of said second conductivity type base layer, a resonant-tunneling of holes occurring from said second conductivity type base layer to said first conductivity type emitter layer when a first voltage is applied across said first conductivity type emitter layer and said second conductivity type base layer, electrons being injected from said first conductivity type emitter layer to said second conductivity type base layer when a second voltage greater than said first voltage is applied across said first conductivity type emitter layer and said second conductivity type base layer, said first and second conductivity types being one and the other of n-type and p-type.

8. A semiconductor memory device as claimed in claim 6 in which said resonant-tunneling bipolar transistor comprises a first conductivity type collector layer, a second conductivity type base layer formed on said first conductivity type collector layer, an emitter barrier layer formed on said second conductivity type base layer, and a first conductivity type emitter layer formed on said emitter barrier layer, said emitter barrier layer comprising at least two barrier layers having such a film thickness that carriers can tunnel through and a quantum well layer provided between said two barrier layers, an absolute value of a difference between a bottom of conduction band of said first conductivity type emitter layer and a bottom of conduction band of said quantum well layer being greater than an absolute value of a difference between a top of valence band of said quantum well layer and a top of valence band of said second conductivity type base layer, said first conductivity type emitter layer having a top of valence band greater than that of said quantum well layer, said quantum well layer having the top of valence band smaller than that of said second conductivity type base layer, a resonant-tunneling of holes occuring from said second conductivity type base layer to said first conductivity type emitter layer when a first voltage is applied across said first conductivity type emitter layer and said second conductivity type base layer, electrons being injected from said first conductivity type emitter layer to said second conductivity type base layer when a second voltage greater than said first voltage is applied across said first conductivity type emitter layer and said second conductivity type base layer, said first and second conductivity types being one and the other of n-type and p-type.

9. A semiconductor memory device comprising:
a bit line;
a word line;
a read line; and
a memory cell comprising a transistor having such a current characteristic that a base current has a differential negative resistance characteristic and a large collector current flows after the differential negative resistance characteristic occurs in the base current when a base-emitter voltage is increased, a load coupled in series to a circuit of a collector and an emitter of said transistor, first and second input terminals coupled to the base of said transistor through a base resistance of said transistor, and an output terminal coupled to the collector of said transistor,
said first input terminal being coupled to said first word line,
said second input terminal being coupled to said bit line,
said output terminal being coupled to said read line.

10. A semiconductor memory device as claimed in claim 9 which further comprises a capacitor coupled between said output terminal and said read line.

11. A semiconductor memory device as claimed in claim 9 in which a write-in operation of said semiconductor memory device is carried out by setting signal levels of both said bit line and said word line to one of high and low levels, and a read-out operation of said semiconductor memory device is carried out by setting a signal level of said word line to a medium level and supplying a timing pulse signal to said bit line, said medium level signal having an intermediate level between said high and low levels.

12. A semiconductor memory device as claimed in claim 11 in which a stored information content is read out during the read-out operation depending on a size of a potential change in an output signal outputted on said read line through said output terminal.

13. A semiconductor memory device as claimed in claim 9 in which said transistor is a resonant-tunneling hot electron transistor.

14. A semiconductor memory device as claimed in claim 13 in which said resonant-tunneling hot electron transistor comprises a specific conductivity type collector layer, a collector barrier layer formed on said specific conductivity type collector layer, a specific conductivity type base layer formed on said collector barrier layer, an emitter barrier layer formed on said specific conductivity type base layer, and a specific conductivity type emitter layer formed on said emitter barrier layer, said emitter barrier layer comprising at least two barrier layers having such a film thickness that carriers can tunnel through and a quantum well layer provided between said two barrier layers, said collector barrier layer having a barrier height greater than a potential of carriers injected to said specific conductivity type base layer by resonant-tunneling through said emitter barrier layer when a first voltage is applied across said specific conductivity type base layer and said specific conductivity type emitter layer, the potential of carriers injected to said specific conductivity type base layer when a second voltage greater than said first voltage is applied across said specific conductivity type base layer and said specific conductivity type emitter layer being greater than the barrier height of said collector barrier layer, said specific conductivity type being one of n-type and p-type.

15. A semiconductor memory device as claimed in claim 9 in which said transistor is a resonant-tunneling bipolar transistor.

16. A semiconductor memory device as claimed in claim 15 in which said resonant-tunneling bipolar transistor comprises a first conductivity type collector layer, a second conductivity type base layer formed on said first conductivity type collector layer, an emitter barrier layer formed on said second conductivity type base layer, and a first conductivity type emitter layer formed on said emitter barrier layer, said emitter barrier layer comprising at least two barrier layers having such a film thickness that carriers can tunnel through and a quantum well layer provided between said two barrier layers, said first conductivity type emitter layer having a bottom of conduction band greater than that of said quantum well layer, said first conductivity type emitter layer having a top of valence band greater than that of said quantum well layer, said quantum well layer having a top of valence band smaller than that of said second conductivity type base layer, a resonant tunneling of holes occurring from said second conductivity type base layer to said first conductivity type emitter layer when a first voltage is applied across said first conductivity type emitter layer and said second conductivity type base layer, electrons being injected from said first conductivity type emitter layer to said second conductivity type base layer when a second voltage greater than said first voltage is applied across said first conductivity type emitter layer and said second conductivity type base layer, said first and second conductivity types being one and the other of n-type and p-type.

17. A semiconductor memory device as claimed in claim 15 in which said resonant-tunneling bipolar transistor comprises a first conductivity type collector layer, a second conductivity type base layer formed on said first conductivity type collector layer, an emitter barrier layer formed on said second conductivity type base layer, and a first conductivity type emitter layer formed on said emitter barrier layer, said emitter barrier layer comprising at least two barrier layers having such a film thickness that carriers can tunnel through and a quantum well layer provided between said two barrier layers, an absolute value of a difference between a bottom of conduction band of said first conductivity type emitter layer and a bottom of conduction band of said quantum well layer being greater than an absolute value of a difference between a top of valence band of said quantum well layer and a top of valence band of said second conductivity type base layer, said first conductivity type emitter layer having a top of valence band greater than that of said quantum well layer, said quantum well layer having the top of valence band smaller than that of said second conductivity type base layer, a resonant tunneling of holes occurring from said second conductivity type base layer to said first conductivity type emitter layer when a first voltage is applied across said first conductivity type emitter layer and said second conductivity type base layer, electrons being injected from said first conductivity type emitter layer to said second conductivity type base layer when a second voltage greater than said first voltage is applied across said first conductivity type emitter layer and said second conductivity type base layer, said first and second conductivity types being one and the other of n-type and p-type.

18. A semiconductor memory device comprising:
   a plurality of bit lines;
   a plurality of word lines;
   a plurality of read lines; and
   a memory cell array constituted by a plurality of identical memory cells, each of said memory cells being connected to one of said bit lines, one of said word lines and one of said read lines,
   each of said memory cells comprising a transistor having such a current characteristic that a base current has a differential negative resistance characteristic and a large collector current flows after the differential negative resistance characteristic occurs in the base current when a base-emitter voltage is increased, a load coupled in series to a circuit of a collector and an emitter of said transistor, first and second input terminals coupled to the base of said transistor through a base resistance of said transistor, and an output terminal coupled to the collector of said transistor,
   said first input terminal being coupled to a corresponding one of said word lines,
   said second input terminal being coupled to a corresponding one of said bit lines,
   said output terminal being coupled to a corresponding one of said read lines.

19. A semiconductor memory device as claimed in claim 18 in which each memory cell further comprises a capacitor coupled between said output terminal and a corresponding one of said read lines.

20. A semiconductor memory device as claimed in claim 18 in which a write-in operation of said semiconductor memory device to a predetermined memory cell is carried out by setting signal levels of both a predetermined one of said bit lines coupled to said predetermined memory cell and a predetermined one of said word lines coupled to said predetermined memory cell to one of high and low levels, and a read-out operation of said semiconductor memory device from the predetermined memory cell is carried out by setting a signal level of said predetermined word line to a medium level and supplying a timing pulse signal to the predetermined one of said bit lines, said medium level signal having an intermediate level between said high and low levels.

21. A semiconductor memory device as claimed in claim 20 in which a stored information content is read out from said predetermined memory cell during the read-out operation depending on a size of a potential change in an output signal outputted on a predetermined one of said read lines coupled to said predetermined memory cell through said output terminal thereof.

22. A semiconductor memory device as claimed in claim 18 in which said transistor is a resonant-tunneling hot electron transistor.

23. A semiconductor memory device as claimed in claim 22 in which said resonant-tunneling hot electron transistor comprises a specific conductivity type collector layer, a collector barrier layer formed on said specific conductivity type collector layer, a specific conductivity type base layer formed on said collector barrier layer, an emitter barrier layer formed on said specific conductivity type base layer, and a specific conductivity type emitter layer formed on said emitter barrier layer, said emitter barrier layer comprising at least two barrier layers having such a film thickness that carriers can tunnel through and a quantum well layer provided between said two barrier layers, said collector barrier layer having a barrier height greater than a potential of carriers injected to said specific conductivity type base layer by resonant-tunneling through said emitter barrier layer when a first voltage is applied across said specific conductivity type base layer and said specific conductivity type emitter layer, the potential of carriers injected to said specific conductivity type base layer when a second voltage greater than said first voltage is applied across said specific conductivity type base layer and said specific conductivity type emitter layer being greater than the barrier height of said collector barrier layer, said specific conductivity type being one of n-type and p-type.

24. A semiconductor memory device as claimed in claim 18 in which said transistor is a resonant-tunneling bipolar transistor.

25. A semiconductor memory device as claimed in claim 24 in which said resonant-tunneling bipolar transistor comprises a first conductivity type collector layer, a second conductivity type base layer formed on said first conductivity type collector layer, an emitter barrier layer formed on said second conductivity type base layer, and a first conductivity type emitter layer formed on said emitter barrier layer, said emitter barrier layer comprising at least two barrier layers having such a film thickness that carriers can tunnel through and a quantum well layer provided between said two barrier layers, said first conductivity type emitter layer having a bottom of conduction band greater than that of said quantum well layer, said first conductivity type emitter layer having a top of valence band greater than that of said quantum well layer, said quantum well layer having a top of valence band smaller than that of said second conductivity type base layer, a resonant tunneling of holes occurring from said second conductivity type base layer to said first conductivity type emitter layer when a first voltage is applied across said first conductivity type emitter layer and said second conductivity type base layer, electrons being injected from said first conductivity type emitter layer to said second conductivity type base layer when a second voltage greater than said first voltage is applied across said first conductivity type emitter layer and said second conductivity type base layer, said first and second conductivity types being one and the other of n-type and p-type.

26. A semiconductor memory device as claimed in claim 24 in which said resonant-tunneling bipolar transistor comprises a first conductivity type collector layer, a second conductivity type base layer formed on said first conductivity type collector layer, an emitter barrier layer formed on said second conductivity type base layer, and a first conductivity type emitter layer formed on said emitter barrier layer, said emitter barrier layer comprising at least two barrier layers having such a film thickness that carriers can tunnel through and a quantum well layer provided between said two barrier layers, an absolute value of a difference between a bottom of conduction band of said first conductivity type emitter layer and a bottom of conduction band of said quantum well layer being greater than an absolute value of a difference between a top of valence band of said quantum well layer and a top of valence band of said second conductivity type base layer, said first conductivity type emitter layer having a top of valence band greater than that of said quantum well layer, said quantum well layer having the top of valence band smaller than that of said second conductivity type base layer, a resonant tunneling of holes occurring from said second conductivity type base layer to said first conductivity type emitter layer when a first voltage is applied across said first conductivity type emitter layer and said second conductivity type base layer, electrons being injected from said first conductivity type emitter layer to said second conductivity type base layer when a second voltage greater than said first voltage is applied across said first conductivity type emitter layer and said second conductivity type base layer, said first and second conductivity types being one and the other of n-type and p-type.

* * * * *